(12) United States Patent
Cekli et al.

(10) Patent No.: US 11,036,148 B2
(45) Date of Patent: *Jun. 15, 2021

(54) PATTERNING DEVICE COOLING SYSTEM AND METHOD OF THERMALLY CONDITIONING A PATTERNING DEVICE (71) Applicant: ASML NETHERLANDS B.V., Veldhoven (NL)

(72) Inventors: Hakki Ergün Cekli, Eindhoven (NL); Güneş Nakiboğlu, Eindhoven (NL); Frank Johannes Jacobus Van Boxtel, Eindhoven (NL); Jean-Philippe Xavier Van Damme, Wezembeek-Oppem (BE); Richard Johannes Franciscus Van Haren, Waalre (NL)

(73) Assignee: ASML NETHERLANDS B.V., Veldhoven (NL)

( * ) Notice: Subject to any disclaimer, the term of this patent is extended or adjusted under 35 U.S.C. 154(b) by 0 days.

This patent is subject to a terminal disclaimer.

(21) Appl. No.: 16/700,586

(22) Filed: Dec. 2, 2019

(65) Prior Publication Data

US 2020/0103767 A1 Apr. 2, 2020

Related U.S. Application Data

(63) Continuation of application No. 16/086,343, filed as application No. PCT/EP2017/053513 on Feb. 16, 2017, now Pat. No. 10,495,986.

(30) Foreign Application Priority Data

Mar. 24, 2016 (EP) ..................... 16162204

(51) Int. Cl.
*G03F 7/20* (2006.01)

(52) U.S. Cl.
CPC ...... *G03F 7/70875* (2013.01); *G03F 7/70633* (2013.01); *G03F 7/70783* (2013.01); *G03F 7/70866* (2013.01)

(58) Field of Classification Search
CPC ............. G03F 7/70866; G03F 7/70633; G03F 7/70783

See application file for complete search history.

(56) References Cited

U.S. PATENT DOCUMENTS 4,503,335 A 3/1985 Takahashi
10,495,986 B2 * 12/2019 Cekli .................. G03F 7/70783
(Continued)

FOREIGN PATENT DOCUMENTS

DE 102009036953 2/2011
EP 1120690 A2 8/2001
(Continued)

OTHER PUBLICATIONS

"Reticle Cooling: Impinging Coolant Flow Switched to Follow Reticle Motion", Research Disclosure, vol. 616, No. 2, Jun. 24, 2015, 5 pages.
(Continued)

*Primary Examiner* — Michelle M Iacoletti
(74) *Attorney, Agent, or Firm* — Pillsbury Winthrop Shaw Pittman, LLP (57) ABSTRACT

A patterning device cooling system for thermally conditioning a patterning device of a lithographic apparatus, wherein the patterning device in use, is being irradiated by exposure radiation, wherein the patterning device cooling system comprises: a thermal conditioner configured to thermally condition the patterning device; and a controller configured to control the thermal conditioner to thermally condition the patterning device dependent on an amount of the exposure radiation absorbed by the patterning device.

21 Claims, 5 Drawing Sheets

(56) References Cited

U.S. PATENT DOCUMENTS

| | | |
|---|---|---|
| 2004/0053169 A1 | 3/2004 | Kindt |
| 2012/0133914 A1 | 5/2012 | Prosyentsov et al. |
| 2014/0272717 A1 | 9/2014 | Cheng et al. |
| 2015/0168854 A1 | 6/2015 | Westerlaken |
| 2015/0212432 A1 | 7/2015 | Onvlee et al. |
| 2015/0241796 A1 | 8/2015 | Ebert, Jr. et al. |

FOREIGN PATENT DOCUMENTS

| | | | |
|---|---|---|---|
| EP | 1120690 A3 | 12/2004 | |
| JP | 06260387 A * | 9/1994 | ......... G03F 7/70875 |
| JP | 08288206 | 11/1996 | |
| JP | H09102450 | 4/1997 | |
| JP | H09275070 | 10/1997 | |
| JP | 2000068193 | 3/2000 | |
| JP | 2001217177 | 8/2001 | |
| JP | 2004063847 | 2/2004 | |
| JP | 3622867 | 12/2004 | |
| JP | 2006295148 | 10/2006 | |
| JP | 2008103409 | 5/2008 | |
| JP | 2010080855 | 4/2010 | |
| JP | 2012004157 | 1/2012 | |
| JP | 2015-536476 A | 12/2015 | |
| TW | 201227858 | 7/2012 | |
| WO | 2010109647 | 9/2012 | |
| WO | WO-2014067802 A1 * | 5/2014 | ......... G03F 7/70858 |

OTHER PUBLICATIONS

Taiwanese Office Action issued in corresponding Taiwanese Patent Application No. 106109281, dated Feb. 6, 2018.

International Search Report issued in corresponding PCT Patent Application No. PCT/EP2017/053513, dated Jun. 6, 2018.

Office Action dated Dec. 25, 2019 issued in corresponding Chinese Patent Application No. 201780019458.3 with English translation.

Notice of Reasons for Rejection dated Apr. 13, 2020 issued in corresponding Japanese Patent Application No. 2018-548349 with English translation.

* cited by examiner

PATTERNING DEVICE COOLING SYSTEM AND METHOD OF THERMALLY CONDITIONING A PATTERNING DEVICE

This application is a continuation of U.S. patent application Ser. No. 16/086,343, filed Sep. 19, 2018, now allowed, which is the U.S. national phase entry of PCT/EP2017/053513, filed on Feb. 16, 2017, which claims the benefit of priority of European patent application no. 16162204.8, filed on Mar. 24, 2016, each of the foregoing applications is incorporated herein in its entirety by reference.

FIELD

The present description relates to a patterning device cooling system and a method of thermally conditioning a patterning device.

BACKGROUND

A lithographic apparatus is a machine that applies a desired pattern onto a substrate, usually onto a target portion of the substrate. A lithographic apparatus can be used, for example, to manufacture integrated circuits (ICs). In such a case, a patterning device, for example, a mask or a reticle, can generate a circuit pattern to be formed on an individual layer of the exposed substrate. This pattern can be transferred onto a target portion (for example, including part of, one, or several dies) on a substrate (for example, a silicon wafer). Transfer of the pattern is typically via imaging onto a layer of radiation-sensitive material (resist) provided on the substrate. Generally, a single substrate will contain a network of adjacent target portions that are successively patterned. Conventional lithographic apparatuses include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction.

SUMMARY

During use of the lithographic apparatus, a radiation beam is incident on the patterning device. Some of the energy from the radiation beam is absorbed by the patterning device, causing the patterning device to heat up. Heating of the patterning device can cause an increase in overlay, for example. This is because heating of the patterning device can cause the patterning device to expand and mechanically deform. If the patterning device expands and/or mechanically deforms, the circuit pattern formed on an individual layer of an exposed substrate may be undesirably affected.

It is desirable, for example, to reduce the effect that heating of the patterning device has on overlay between layers of an exposed substrate.

According to an aspect, there is provided a patterning device cooling system for thermally conditioning a patterning device of a lithographic apparatus, wherein the patterning device in use, is being irradiated by exposure radiation, wherein the patterning device cooling system comprises: a thermal conditioner configured to thermally condition the patterning device; and a controller configured to control the thermal conditioner dependent on an amount of the exposure radiation absorbed by the patterning device.

According to an aspect, there is provided a method of thermally conditioning a patterning device of a lithographic apparatus, the patterning device being irradiated by exposure radiation in use, the method comprising: thermally conditioning the patterning device dependent on an amount of the exposure radiation absorbed by the patterning device.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

The disclosed embodiment(s) merely exemplify the invention. The scope of the invention is not limited to the disclosed embodiment(s). The invention is defined by the claims appended hereto.

The embodiment(s) described, and references in the specification to "an example," "one embodiment," "an embodiment," "an example embodiment," "some embodiments," etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Before describing such embodiments in more detail, however, it is instructive to present an example environment in which embodiments of this disclosure may be implemented.

Figure 1:
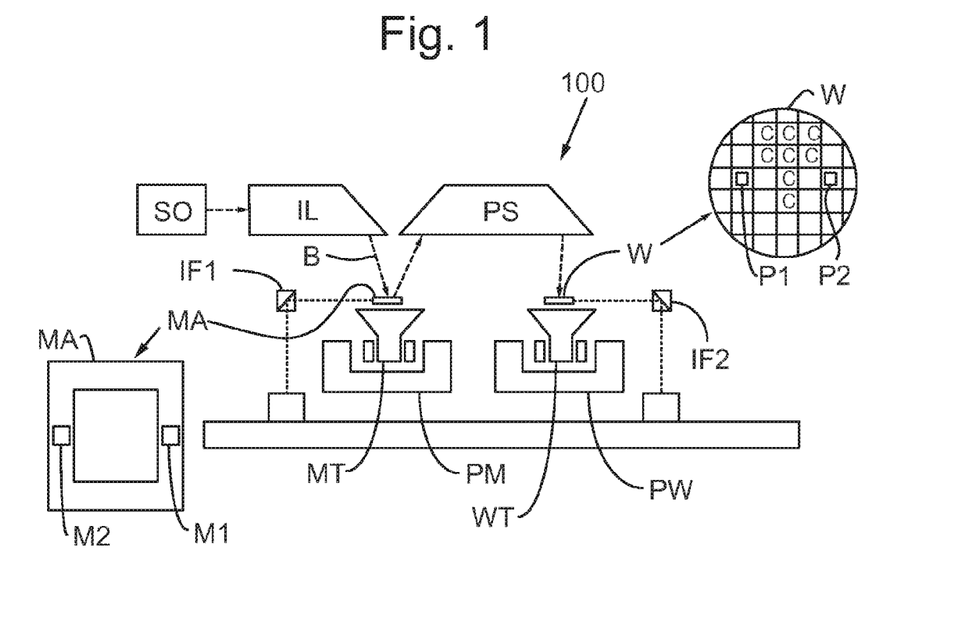
FIG. 1 is a schematic illustration of a reflective lithographic apparatus according to an embodiment.
Figure 2:
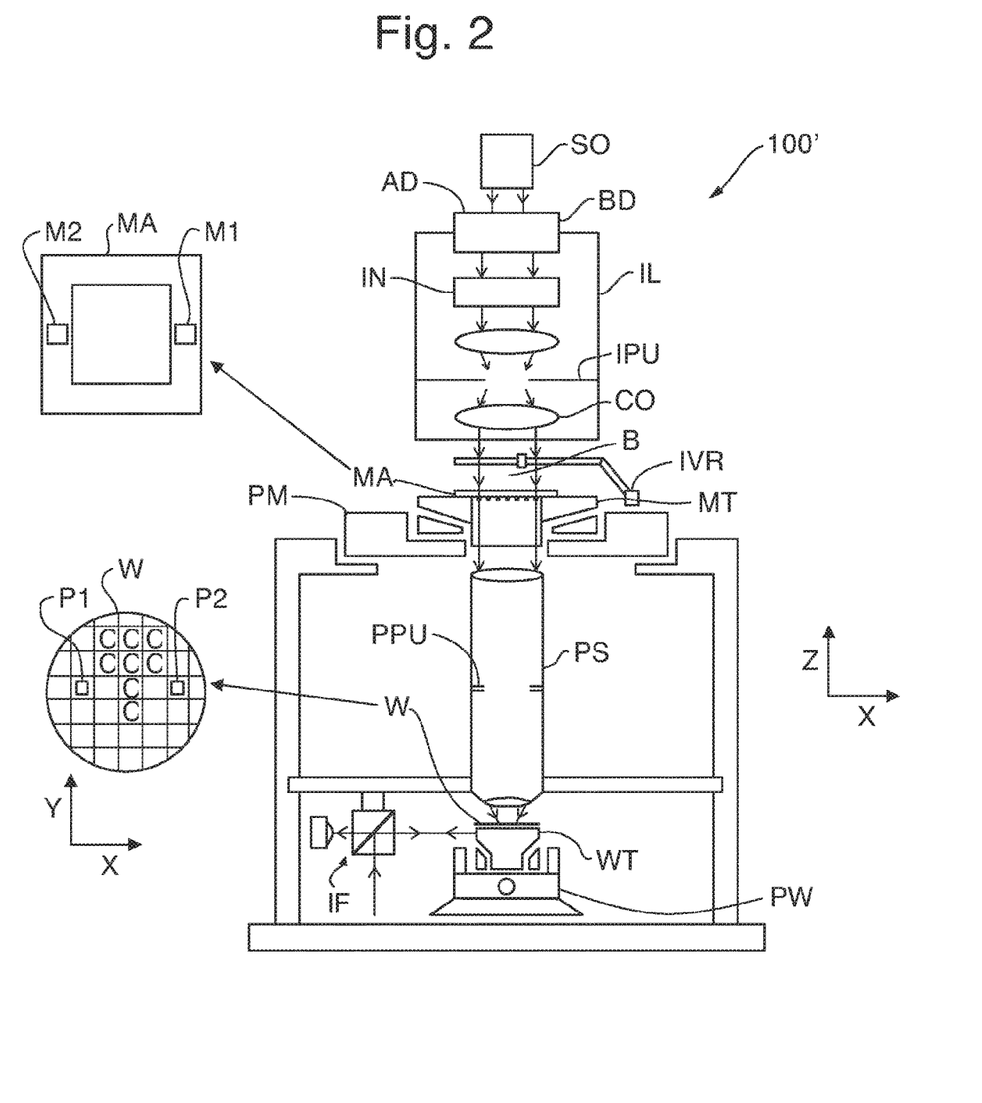
FIG. 2 is a schematic illustration of a transmissive lithographic apparatus according to an embodiment.

FIGS. 1 and 2 are schematic illustrations of a lithographic apparatus 100 and lithographic apparatus 100', respectively, in which embodiments of this disclosure may be implemented. Lithographic apparatus 100 and lithographic apparatus 100' each include the following: an illumination system (illuminator) IL configured to condition a radiation beam B (for example, DUV or EUV radiation); a support structure (for example, a mask table) MT configured to support a patterning device (for example, a mask, a reticle, or a dynamic patterning device) MA and connected to a first positioner PM configured to accurately position the patterning device MA; and, a substrate table (for example, a wafer table) WT configured to hold a substrate (for example, a resist coated wafer) W and connected to a second positioner PW configured to accurately position the substrate W. Lithographic apparatuses 100 and 100' also have a projection system PS configured to project a pattern imparted to the radiation beam B by patterning device MA onto a target portion (for example, comprising part of one or more dies) C of the substrate W. In lithographic apparatus 100, the patterning device MA and the projection system PS are reflective. In lithographic apparatus 100', the patterning device MA and the projection system PS are transmissive. In some embodiments, the projection system PS is catadioptric.

The illumination system IL may include various types of optical components, such as refractive, reflective, magnetic, electromagnetic, electrostatic, or other types of optical components, or any combination thereof, for directing, shaping, or controlling the radiation beam B.

The support structure MT holds the patterning device MA in a manner that depends on the orientation of the patterning device MA, the design of the lithographic apparatuses 100 and 100', and other conditions, such as whether or not the patterning device MA is held in a vacuum environment. The support structure MT may use mechanical, vacuum, electrostatic, or other clamping techniques to hold the patterning device MA. The support structure MT can be a frame or a table, for example, which can be fixed or movable, as required. The support structure MT can ensure that the patterning device MA is at a desired position, for example, with respect to the projection system PS.

The term "patterning device" MA should be broadly interpreted as referring to any device that can be used to impart a radiation beam B with a pattern in its cross-section, such as to create a pattern in the target portion C of the substrate W. The pattern imparted to the radiation beam B can correspond to a particular functional layer in a device being created in the target portion C, such as an integrated circuit.

The patterning device MA may be transmissive (as in lithographic apparatus 100' of FIG. 2) or reflective (as in lithographic apparatus 100 of FIG. 1). Examples of patterning devices MA include reticles, masks, programmable mirror arrays, and programmable LCD panels. Masks are well known in lithography, and include mask types such as binary, alternating phase shift, and attenuated phase shift, as well as various hybrid mask types. An example of a programmable mirror array employs a matrix arrangement of small mirrors, each of which can be individually tilted so as to reflect an incoming radiation beam in different directions. The tilted mirrors impart a pattern in the radiation beam B which is reflected by the mirror matrix.

The term "projection system" PS can encompass any type of projection system, including refractive, reflective, catadioptric, magnetic, electromagnetic and electrostatic optical systems, or any combination thereof, as appropriate for the exposure radiation being used, or for other factors, such as the use of an immersion liquid or the use of a vacuum. A vacuum environment can be used for EUV or electron beam radiation since other gases can absorb too much radiation or electrons. A vacuum environment can therefore be provided to the whole beam path with the aid of a vacuum wall and vacuum pumps.

Lithographic apparatus 100 and/or lithographic apparatus 100' can be of a type having two or more tables (or stage(s) or support(s)), e.g., two or more substrate tables WT (or support structures MA) or a combination of one or more substrate tables WT and one or more sensor or measurement tables configured to measure properties of the projection system PS and not configured to hold a substrate W. In such "multiple stage" machines, the additional substrate tables WT can be used in parallel, or preparatory steps can be carried out on one or more tables while one or more other substrate tables WT are being used for exposure.

Referring to FIGS. 1 and 2, the illumination system IL receives a radiation beam B from a source SO of radiation. The source SO and the lithographic apparatuses 100, 100' can be separate entities, for example, when the source SO is an excimer laser. In such cases, the source SO is not considered to form part of the lithographic apparatuses 100 or 100', and the radiation beam B passes from the source SO to the illumination system IL with the aid of a beam delivery system BD (in FIG. 2) including, for example, suitable directing mirrors and/or a beam expander. In other cases, the source SO can be an integral part of the lithographic apparatuses 100, 100'—for example when the source SO is a mercury lamp. The source SO and the illumination system IL, together with the beam delivery system BD, if required, can be referred to as a radiation system.

The illumination system IL can include an adjuster AD (in FIG. 2) for adjusting the angular intensity distribution of the radiation beam. Generally, at least the outer and/or inner radial extent (commonly referred to as "σ-outer" and "σ-inner," respectively) of the intensity distribution in a pupil planar of the illumination system IL can be adjusted. In addition, the illumination system IL can comprise various other components (in FIG. 2), such as an integrator IN and a condenser CO. The illumination system IL can be used to condition the radiation beam B to have a desired uniformity and intensity distribution in its cross section. Similar to the source SO, the illumination system IL may or may not be considered to form part of the lithographic apparatus. For example, the illumination system IL may be an integral part of the lithographic apparatus or may be a separate entity from the lithographic apparatus. In the latter case, the lithographic apparatus may be configured to allow the illumination system IL to be mounted thereon. Optionally, the illumination system IL is detachable and may be separately provided (for example, by the lithographic apparatus manufacturer or another supplier).

Referring to FIG. 1, the radiation beam B is incident on the patterning device (for example, mask) MA, which is held on the support structure (for example, mask table) MT, and is patterned by the patterning device MA. In lithographic apparatus 100, the radiation beam B is reflected from the patterning device (for example, mask) MA. After being reflected from the patterning device (for example, mask) MA, the radiation beam B passes through the projection system PS, which focuses the radiation beam B onto a target portion C of the substrate W. With the aid of the second positioner PW and position sensor IF2 (for example, an interferometric device, linear encoder, or capacitive sensor), the substrate table WT can be moved accurately (for example, so as to position different target portions C in the path of the radiation beam B). Similarly, the first positioner PM and another position sensor IF1 can be used to accurately position the patterning device (for example, mask) MA with respect to the path of the radiation beam B. Patterning device (for example, mask) MA and substrate W can be aligned using mask alignment marks M1, M2 and substrate alignment marks P1, P2.

Referring to FIG. 2, the radiation beam B is incident on the patterning device MA (for example, mask), which is held on the support structure MT (for example, mask table), and is patterned by the patterning device MA. Having traversed the mask, the radiation beam B passes through the projection system PS, which focuses the beam onto a target portion C of the substrate W. The projection system has a pupil PPU conjugate to an illumination system pupil IPU. Portions of radiation emanate from the intensity distribution at the illumination system pupil IPU and traverse a mask pattern without being affected by diffraction at a mask pattern create an image of the intensity distribution at the illumination system pupil IPU.

With the aid of the second positioner PW and position sensor IF (for example, an interferometric device, linear encoder, or capacitive sensor), the substrate table WT can be moved accurately (for example, so as to position different target portions C in the path of the radiation beam B). Similarly, the first positioner PM and another position sensor (not shown in FIG. 2) can be used to accurately position the mask with respect to the path of the radiation beam B (for example, after mechanical retrieval from a mask library or during a scan).

In general, movement of the mask table can be realized with the aid of a long-stroke module (coarse positioning) and a short-stroke module (fine positioning), which form part of the first positioner PM. Similarly, movement of the substrate table WT can be realized using a long-stroke module and a short-stroke module, which form part of the second positioner PW. In the case of a stepper (as opposed to a scanner), the mask table can be connected to a short-stroke actuator only or can be fixed. The patterning device MA and the substrate W can be aligned using mask alignment marks M1, M2, and substrate alignment marks P1, P2. Although the substrate alignment marks P1, P2 (as illustrated) occupy dedicated target portions C, they can be located in spaces between target portions (known as scribe-lane alignment marks). Similarly, in situations in which more than one die is provided on the mask, the mask alignment marks M1, M2 can be located between the dies.

The support structure MT and the patterning device MA can be in a vacuum chamber, where an in-vacuum robot IVR can be used to move patterning devices MA such as a mask in and out of vacuum chamber. Alternatively, when support structure MT and the patterning device MA are outside of the vacuum chamber, an out-of-vacuum robot can be used for various transportation operation, similar to the in-vacuum robot IVR. Both the in-vacuum and out-of-vacuum robots need to be calibrated for a smooth transfer of any payload (e.g., mask) to a fixed kinematic mount of a transfer station.

The lithographic apparatuses 100 and 100' can be used in at least one of the following modes:

1. In step mode, the support structure (for example, mask table) MT and the substrate table WT are kept essentially stationary, while an entire pattern imparted to the radiation beam B is projected onto a target portion C at one time (i.e., a single static exposure). The substrate table WT is then shifted in the X and/or Y direction so that a different target portion C can be exposed.

2. In scan mode, the support structure (for example, mask table) MT and the substrate table WT are scanned synchronously while a pattern imparted to the radiation beam B is projected onto a target portion C (i.e., a single dynamic exposure). The velocity and direction of the substrate table WT relative to the support structure (for example, mask table) MT can be determined by the (de-)magnification and image reversal characteristics of the projection system PS.

3. In another mode, the support structure (for example, mask table) MT is kept substantially stationary holding a programmable patterning device, and the substrate table WT is moved or scanned while a pattern imparted to the radiation beam B is projected onto a target portion C. A pulsed radiation source SO can be employed and the programmable patterning device is updated as required after each movement of the substrate table WT or in between successive radiation pulses during a scan. This mode of operational can be readily applied to maskless lithography that utilizes a programmable patterning device, such as a programmable mirror array of a type as referred to herein.

Combinations and/or variations on the described modes of use or entirely different modes of use can also be employed.

Although specific reference can be made in this text to the use of lithographic apparatus in the manufacture of ICs, it should be understood that the patterning apparatus and lithographic apparatus described herein can have other applications, such as the manufacture of integrated optical systems, guidance and detection patterns for magnetic domain memories, flat-panel displays, liquid-crystal displays (LCDs), and thin-film magnetic heads. The skilled artisan will appreciate that, in the context of such alternative applications, any use of the terms "wafer" or "die" herein can be considered as synonymous with the more general terms "substrate" or "target portion," respectively. The substrate referred to herein can be processed, before or after exposure, in for example a track (a tool that typically applies a layer of resist to a substrate and develops the exposed resist), a metrology tool, and/or an inspection tool. Where applicable, the disclosure herein can be applied to such and other substrate processing tools. Further, the substrate can be processed more than once, for example, in order to create a multi-layer exposed substrate, so that the term substrate used herein can also refer to a substrate that already contains one or multiple processed layers.

Although specific reference may have been made above to the use of embodiments in the context of optical lithography, it will be appreciated that the embodiments may be used in other applications, for example imprint lithography, and where the context allows, is not limited to optical lithography. In imprint lithography, a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

In the embodiments described herein, the terms "lens" and "lens element," where the context allows, can refer to any one or combination of various types of optical components, including refractive, reflective, magnetic, electromagnetic, and electrostatic optical components.

Further, the terms "radiation" and "beam" used herein encompass all types of electromagnetic radiation, including ultraviolet (UV) radiation (for example, having a wavelength $\lambda$ of 365, 248, 193, 157 or 126 nm), extreme ultraviolet (EUV or soft X-ray) radiation (for example, having a wavelength in the range of 5-20 nm such as, for example, 13.5 nm), or hard X-ray working at less than 5 nm, as well as particle beams, such as ion beams or electron beams. Generally, radiation having wavelengths between about 780-3000 nm (or larger) is considered IR radiation. UV refers to radiation with wavelengths of approximately 100-400 nm. Within lithography, the term "UV" also applies to the wavelengths that can be produced by a mercury discharge lamp: G-line 436 nm; H-line 405 nm; and/or, I-line 365 nm. Vacuum UV, or VUV (i.e., UV absorbed by gas), refers to radiation having a wavelength of approximately 100-200 nm. Deep UV (DUV) generally refers to radiation having wavelengths ranging from 126 nm to 428 nm, and in an embodiment, an excimer laser can generate DUV radiation used within a lithographic apparatus. It should be appreciated that radiation having a wavelength in the range of, for example, 5-20 nm relates to radiation with a certain wavelength band, of which at least part is in the range of 5-20 nm.

The term "lens," where the context allows, may refer to any one or combination of various types of optical components, including refractive, reflective, magnetic, electromagnetic and electrostatic optical components.

As depicted in the Figures, the apparatus may be of a dry type in which the substrate W is not immersed in a liquid. Alternatively, the apparatus may be of an immersion type in which the substrate W is immersed in a liquid.

Figure 3:
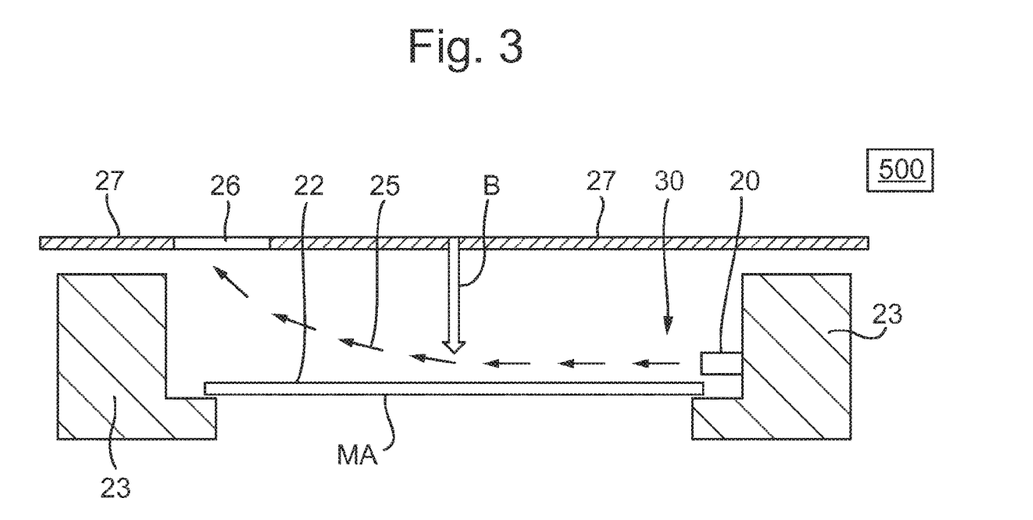
FIG. 3 depicts, in cross-section, a patterning device cooling system according to an embodiment of the invention.

FIG. 3 depicts, in cross-section, a patterning device cooling system 30 according to an embodiment of the invention. In an embodiment the lithographic apparatus comprises a patterning device support structure 23 configured to support the patterning device MA. The patterning device support structure 23 may be the same as the support structure MT (for example, the mask table) as described in relation to FIGS. 1 and 2, and is referred to as the support structure 23 from hereon in. The support structure 23 is configured to support the patterning device MA.

A radiation beam B may be directed to the patterning device MA, such that the patterning device MA can be used to impart a pattern to the radiation beam B. The radiation beam B may comprise DUV radiation or EUV radiation, for example. Generally the radiation beam B is reflected from, or passes through, the patterning device MA. Thus the radiation beam B is generally incident on a surface of the patterning device MA. The radiation beam B and/or temperature variation of the patterning device MA may heat the gas around the patterning device MA. Thus a temperature variation may be introduced to the pattering device MA.

The surface of the patterning device MA may be a planar surface 22, and the planar surface 22 may be heated by the radiation beam B. The planar surface 22 may be substantially flat. However, the planar surface 22 may not be flat, and the planar surface 22 may be a plane used for reference. For example, the planar surface 22 may be a plane at the top of the surface of the patterning device MA, for example, a plane in which the highest points of the patterning device MA are located.

The support structure 23 may use mechanical, vacuum, electrostatic, or other clamping techniques to hold the patterning device MA in place, and/or optionally to hold the patterning device MA to a supporting table (not shown in FIG. 3) that directly supports the patterning device MA on the support structure 23. The support structure 23 may be configured to ensure that the patterning device MA is at a specific position, for example, with respect to other components of the lithographic apparatus. For example, in an embodiment the support structure 23 comprises a moveable component such as a short stroke module and/or a long stroke module, which are configured to position accurately the patterning device MA (e.g. along the X-axis and/or the Y-axis). The support structure 23 can be any appropriate shape to support the patterning device MA and may have an opening beneath the patterning device MA as shown in FIG. 3, or may be solid beneath the patterning device MA (not shown).

In an embodiment the patterning device cooling system 30 comprises a thermal conditioner 20, which may comprise a nozzle, which is a gas outlet. A nozzle is depicted from a side view in FIG. 3. The thermal conditioner 20 is configured to provide a gas flow 25 over the planar surface 22 of the patterning device MA when in use. The thermal conditioner 20 may comprise multiple gas outlets, for example, across the width of the patterning device MA.

As described above, as the radiation beam B is directed to the patterning device MA, the radiation beam B leads to thermal variation of the patterning device MA on which the radiation beam B is incident. Heating of the patterning device MA is a known source of overlay deterioration. In particular, when a high exposure dose is used in combination with a patterning device MA having low transmission, then the patterning device MA heats up significantly, resulting in significant expansion of the patterning device MA. When parameters such as the exposure dose and the transmission (i.e. fraction of the radiation beam B that is transmitted by the patterning device MA) of the patterning device MA are different between two individual layers of an exposed substrate, the expansion of the patterning device MA may occur differently for the two different layers. This can result in an overlay penalty between the two layers of the exposed substrate.

The temperature of the patterning device MA affects overlay because the patterning device MA can expand, i.e. mechanically deform. Additionally, below the patterning device MA, the gas can warm up, thereby changing the refractive index of the gas close to the patterning device MA.

For example, one layer of an exposed substrate may be called a contact layer. The contact layer may comprise the contacts for transistors formed in the exposed substrate. Another layer of the exposed substrate may be called a gate layer. The gate layer may comprise the gate terminal for a plurality of transistors formed in the exposed substrate. A higher exposure dose (i.e. a radiation beam B having higher energy) may be used when forming the circuit pattern for the contact layer compared to the circuit pattern for the gate layer. Furthermore, different patterning devices MA may be used when forming the circuit pattern for the contact layer compared to the circuit pattern for the gate layer. The fraction of the radiation beam B absorbed by the different pattern devices MA may be different. As a result, the patterning device MA may expand differently when forming the contact layer compared to when forming the gate layer. This may result in the circuit patterns for the contact layer and the gate layer being affected differently by heating of the patterning device MA. This can result in an increase in overlay between the contact layer and the gate layer, for example. This phenomenon is not limited to the contact layer and the gate layer. This phenomenon can occur between any two layers of an exposed substrate.

In known systems, a patterning device cooling concept has been introduced to decrease the temperature of the patterning device MA by providing a cooling flow from the nozzle mounted on the support structure 23, as shown in FIG. 3. Although the cooling concept is successful to an extent, there can still be significant overlay deterioration between layers of the exposed substrate. This is because the heating response of the patterning device MA during exposure of one layer is generally different from the heating response of the patterning device MA during exposure of another layer. This results in an overlay penalty. This is illustrated in FIG. 5.

Figure 5:
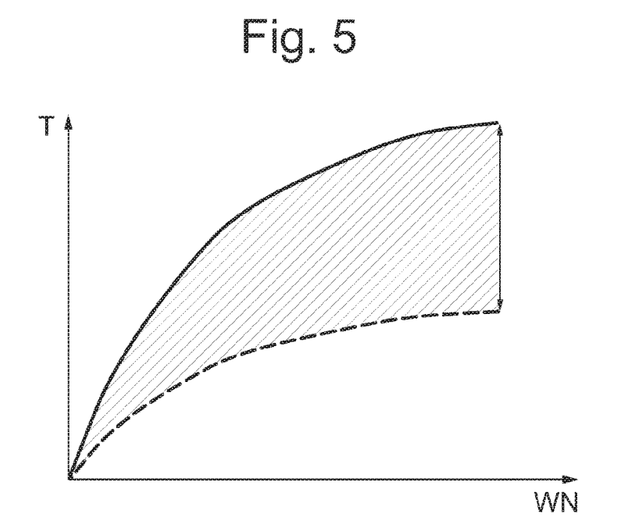
FIGS. 5 and 6 are graphs showing the relationship between the number of a substrate within a batch of substrates and the temperature of the patterning device according to the prior art.

In FIG. 5, the x-axis represents the substrate number WN of a substrate W in a batch of substrates W. The y-axis represents the temperature T of the patterning device MA. The upper solid graph line shows how the temperature T of the patterning device MA increases throughout the batch of substrates W when providing the circuit pattern for a contact layer on the substrates W. The lower dashed graph line shows a different relationship between the temperature T of the patterning device MA and the substrate number WN in the batch of substrates W when exposing the circuit pattern for a gate layer on the substrates W.

As shown in FIG. 5, the patterning device MA increases in temperature more rapidly for the contact layer than for the gate layer. As a result, there is an overlay penalty between the contact layer and the gate layer. The overlay penalty is related to the difference between the two graph lines, as represented by the shaded area and the double-ended arrow in FIG. 5. As can be seen in FIG. 5, the overlay penalty can increase throughout the batch of substrates W.

The reason that the patterning device MA may increase in temperature more for a contact layer compared to for a gate layer is that a contact layer generally has more features and uses a patterning device MA having lower transmission (and hence absorbing a greater proportion of incident radiation). In other words, the patterning device MA absorbs more energy when a contact layer is being formed on a substrate W compared to a different patterning device MA used for forming a gate layer on the substrate W. A gate layer generally has fewer features than a contact layer.

The patterning device cooling system 30 shown in FIG. 3 is for thermally conditioning the patterning device MA. The patterning device MA in use, is being irradiated by exposure radiation. In an embodiment the patterning device cooling system 30 comprises a thermal conditioner 20. As an example, the thermal conditioner 20 comprises a nozzle, as shown in FIG. 3, for example. The thermal conditioner 20 is configured to thermally condition the patterning device MA. For example, in an embodiment the thermal conditioner 20 is configured to cool (i.e. lower the temperature of) the patterning device MA.

In an embodiment the patterning device cooling system 30 comprises a controller 500. The controller 500 is configured to control the thermal conditioner 20 to thermally condition the patterning device MA. In an embodiment the controller 500 is configured to control the thermal conditioner 20 dependent on an amount of the exposure radiation absorbed by the patterning device MA.

In an embodiment the controller 500 is configured to control the thermal conditioner 20 to thermally condition the patterning device MA dependent on an amount of exposure radiation per unit time incident on the patterning device MA. The amount of the exposure radiation per unit time incident on the patterning device MA is related to the exposure dose. The greater the dose, the greater the amount of the exposure radiation per unit time incident on the patterning device MA.

The amount of exposure radiation per unit time incident on the patterning device MA may be greater for a contact layer than for a gate layer, for example. By thermally conditioning the patterning device MA dependent on the amount of exposure radiation per unit time incident on the patterning device MA, the overlay penalty between two layers of the exposed substrate can be reduced. For example, in an embodiment the controller 500 is configured to control the thermal conditioner 20 to cool the patterning device MA more strongly when the amount of the exposure radiation per unit time incident on the patterning device MA is greater. Accordingly, the difference in temperature variation of the patterning device MA between two layers of the exposed substrate may be reduced.

Figure 4:
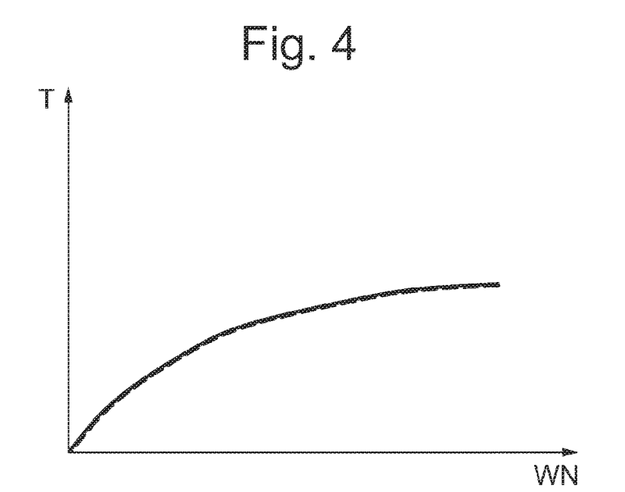
FIG. 4 is a graph showing the relationship between the number of a substrate within a batch of substrates and the temperature of the patterning device according to an embodiment of the invention.

In an ideal situation, the temperature variation of the patterning device MA during exposure of a batch of substrates W is substantially the same for two different layers of the exposed substrate. This is shown in FIG. 4, which shows the temperature variation of the patterning device MA being the same for both the contact layer (shown by a solid graph line) and the gate layer (shown by the dashed graph line). Of course, it may not be possible to completely and/or exactly match the temperature variation of the patterning device MA for two different layers of an exposed substrate. However, any reduction in the difference in temperature variation (relative to the difference between the two graph lines in FIG. 5) is expected to achieve a reduction in overlay between the two layers.

The temperature of a patterning device MA may differ for two different layers of an exposed substrate. For one "hotter" layer, the temperature of the patterning device MA may be higher than for the other "colder" layer. In an embodiment, the controller 500 is configured to lower the temperature of the patterning device MA for the "hotter" layer to match the temperature of the patterning device MA for the "colder" layer. In an alternative embodiment, the controller 500 is configured to raise the temperature of the patterning device MA for the "colder" layer to match the temperature of the patterning device MA for the "hotter" layer.

The amount of the exposure radiation per unit time incident on the patterning device MA is not the only parameter that can cause a difference in temperature variation of the patterning device MA between two different layers. In an embodiment the controller 500 is configured to control the thermal conditioner 20 to thermally condition the patterning device MA dependent on a proportion of the exposure radiation incident on the patterning device MA that is absorbed by the patterning device MA. If a patterning device MA absorbs a higher proportion of exposure radiation, then the patterning device MA will heat up more rapidly. Different patterning devices MA may be used for forming the circuit patterns for different layers of the exposed substrate. By thermally conditioning the patterning device MA dependent on the proportion of the exposure radiation incidents on the patterning device MA that is absorbed by the patterning device MA, the overlay penalty between two different layers of an exposed substrate can be reduced.

In an embodiment the controller 500 is configured to control the thermal conditioner 20 to cool the patterning device MA more strongly when the proportion of the exposure radiation incident on the patterning device MA that is absorbed by the patterning device MA is greater. Accordingly, patterning devices MA that absorb more radiation are cooled more strongly, so that the difference in temperature variation between two different patterning devices MA is reduced. Accordingly, the overlay penalty between the two different layers can be reduced.

The proportion of the exposure radiation incident on the patterning device MA that is absorbed by the patterning device MA is related to the transmission of the patterning device MA. In general, if a patterning device MA transmits a smaller proportion of the radiation beam B, then the patterning device MA absorbs a greater proportion of the radiation beam B.

In an embodiment the controller 500 is configured to control the thermal conditioner 20 to thermally condition the patterning device MA dependent on a scanning speed at which the patterning device MA is scanned by the exposure radiation. The scanning speed is the speed at which a spot from the radiation beam B of the exposure radiation moves across the planar surface 22 of the patterning device MA. If the scanning speed is lower, then the exposure radiation is incident on the patterning device MA for a longer time period during an exposure operation for a substrate W. If the scanning speed is lower, then the time taken to form the circuit pattern for an individual layer on a substrate is longer.

Accordingly, the amount of radiation absorbed by the patterning device MA is greater, potentially leading to a greater increase in temperature T of the patterning device MA.

By thermally conditioning the patterning device MA dependent on the scanning speed at which the patterning device MA is scanned by the exposure radiation, the overlay penalty between two different layers of an exposed substrate can be reduced. In an embodiment the controller 500 is configured to control the thermal conditioner 20 to cool the patterning device MA more strongly and/or over a longer period of time when the scanning speed is lower. Accordingly, the difference in temperature variation of the patterning device MA for two different layers having two different scanning speeds can be reduced. Accordingly, the overlay penalty between the two different layers can be reduced.

In an embodiment the controller 500 is configured to control the thermal conditioner 20 to thermally condition the patterning device MA dependent on a length of an exposure path along which the patterning device MA is scanned by the exposure radiation. The exposure path is the path along which a spot from the radiation beam B moves along the planar surface 22 of the patterning device MA. If the exposure path is longer, then the patterning device MA absorbs a greater amount of radiation, potentially leading to a greater increase in temperature T of the patterning device MA.

By thermally conditioning the patterning device MA dependent on the length of the exposure path, the overlay penalty between two layers of an exposed substrate can be reduced. In an embodiment the controller 500 is configured to control the thermal conditioner 20 to cool the patterning device MA more strongly and/or for a longer time period when the length of the exposure path is longer. Accordingly, the difference in temperature variation of the patterning device MA caused by the length of the exposure path being different for two different layers is reduced. Accordingly, the overlay penalty between the two different layers is reduced.

As explained above, there are different parameters which affect the temperature variation of the patterning device MA. These parameters include the amount of the exposure radiation per unit time incident on the patterning device MA, the proportion of the exposure radiation incident on the patterning device MA that is absorbed by the patterning device MA, the scanning speed at which the patterning device MA is scanned by the exposure radiation, and the length of the exposure path along which the patterning device MA is scanned by the exposure radiation. The controller 500 may be configured to control the thermal conditioner 20 to thermally condition the patterning device MA dependent on any subset of these parameters or dependent on all of these parameters.

It is not necessary for the controller 500 to take into account all of these different parameters. In an embodiment the controller 500 is configured to control the thermal conditioner 20 to thermally condition the patterning device MA dependent on only one of these parameters, for example the parameter that is found to have the greatest effect on overlay between two layers.

As depicted in FIG. 3, in an embodiment the thermal conditioner 20 comprises a nozzle configured to supply gas as a thermal conditioning flow to the patterning device MA. In an embodiment the controller 500 is configured to control a temperature of the gas supplied by the thermal conditioner 20. In an embodiment the controller 500 is configured to control a flow rate of the gas provided by the thermal conditioner 20. If the temperature of the gas supplied by the thermal conditioner 20 is lower, then the thermal conditioning flow reduced the temperature of the patterning device MA more strongly. If the flow rate of the gas supplied by the thermal conditioner 20 is greater, then the thermal conditioning flow reduces the temperature of the patterning device MA more strongly.

The parameters that affect the temperature variation of the patterning device MA are associated with particular layers. For example, the exposure dose and type of patterning device MA may be different for forming different layers on the substrates W. These parameters can be taken into account for thermally conditioning the patterning device MA. This adapts the cooling rate of the patterning device MA based on the known effect of layer-specific parameters on the temperature T of the patterning device MA. It is possible to have a specific thermal conditioning recipe for each layer. For example, based on the known exposure parameters for a particular layer, the controller 500 can control the thermal conditioner 20 to thermally condition the patterning device MA in a specific way (i.e. according to a specific recipe).

The parameters mentioned above may be called physical quantities associated with exposure of a particular layer of a substrate stack. In an embodiment there is provided a method of thermally conditioning a patterning device MA for a lithographic apparatus. In an embodiment the method comprises thermally conditioning the patterning device MA dependent on at least one physical quantity associated with the exposure of a first layer of a substrate stack. The substrate stack is a substrate W on which a plurality of individual layers are formed to create an exposed substrate. In an embodiment the method comprises thermally conditioning the patterning device MA (which may be a different patterning device MA from the patterning device MA used for the first layer) dependent on at least one physical quantity associated with the exposure of a second layer of the substrate stack. The at least one physical quantity associated with the exposure of the first layer is different from the at least one physical quantity associated with exposure of the second layer. For example, a different patterning device MA may be used for the two layers. The exposure dose, scanning speed and/or length of the exposure path may be different for the two different layers.

In an embodiment the method comprises controlling a temperature of gas supplied to the patterning device MA such that the temperature of gas when exposing the first layer is different from the temperature of gas than exposing the second layer. In an embodiment the method comprises controlling a flow rate supplied to the patterning device MA such that the flow rate of gas when exposing the first layer is different from the flow rate when exposing the second layer. Accordingly, the patterning device MA may be cooled differently depending on the layer that is being formed in an exposure operation.

As explained above, the thermal conditioning of the patterning device MA may be controlled so that the temperature T of the patterning device MA varies in substantially the same way for two different layers during exposure of a whole batch of substrates W. In an embodiment the method comprises thermally conditioning the patterning device MA during a batch exposure operation for forming a patterned layer on each a batch of substrates W, such that the temperature of the patterning device MA during the batch exposure operation substantially matches a known temperature of a patterning device MA during another batch exposure operation for forming another pattern layer on each of the batch of substrates W.

Accordingly, an embodiment of the invention is expected to achieve a reduction in drift of the position of circuit patterns between two different layers of a substrate W. This is done by varying the rates of cooling according to exposure conditions. It is currently thought that the most important exposure conditions related to heating of the patterning device MA are the transmission of the patterning device MA (which is related to the proportion of the radiation beam B that the patterning device MA absorbs), exposure dose and exposure speed (i.e. the scanning speed at which the patterning device MA is scanned by the exposure radiation). As a result of controlled cooling it is possible to match the heating characteristics of the patterning device MA for two different layers as shown in FIG. 4. If both layers have more similar or the same impact from the heating of the patterning device MA, then the overlay contribution between the two different layers can be reduced, or even eliminated.

In an embodiment the temperature and/or flow rates of the gas flow from the thermal conditioner 20 can be varied throughout the batch of substrates W.

An embodiment of the invention can be realized in a finer granularity than a whole batch of substrates W. For example, it has been found that there can be a difference in temperature variation of the patterning device MA between two different layers over the course of exposing a single substrate W (as well as over the course of exposing a whole batch of substrates W described above). Accordingly, an embodiment of the invention can be used to reduce drift caused by heating of the patterning device MA within the exposure operation of a single substrate W.

Figure 6:
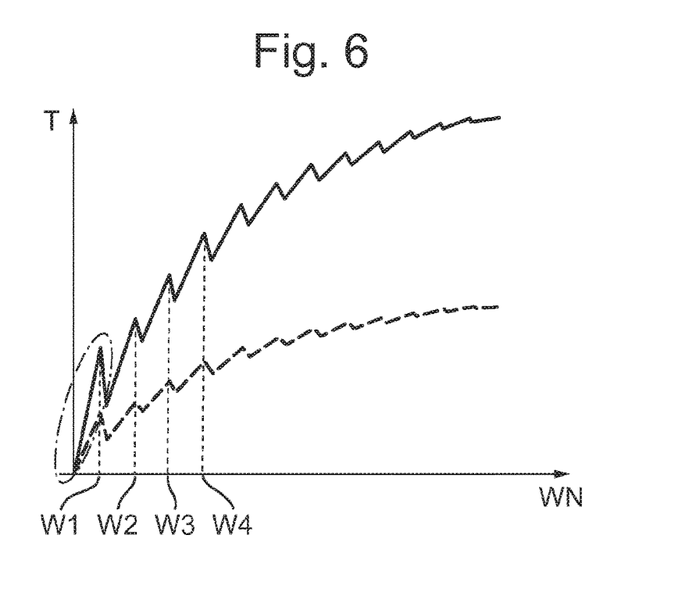

As shown in FIG. 6, there can be a drift in temperature of the patterning device MA within the exposure operation of a single substrate (i.e. from the first to the last target portions C). This drift within exposure of a single substrate W can be significant especially for the first substrate W in a batch of substrates W, as shown in the circled region in FIG. 6. The flow rate and/or temperature of the thermal conditioning flow provided by the thermal conditioner 20 can be tuned so as to reduce this drift within a single substrate W. It is possible to reduce the difference between temperature variation for two different layers even within a single substrate W.

Figure 7:
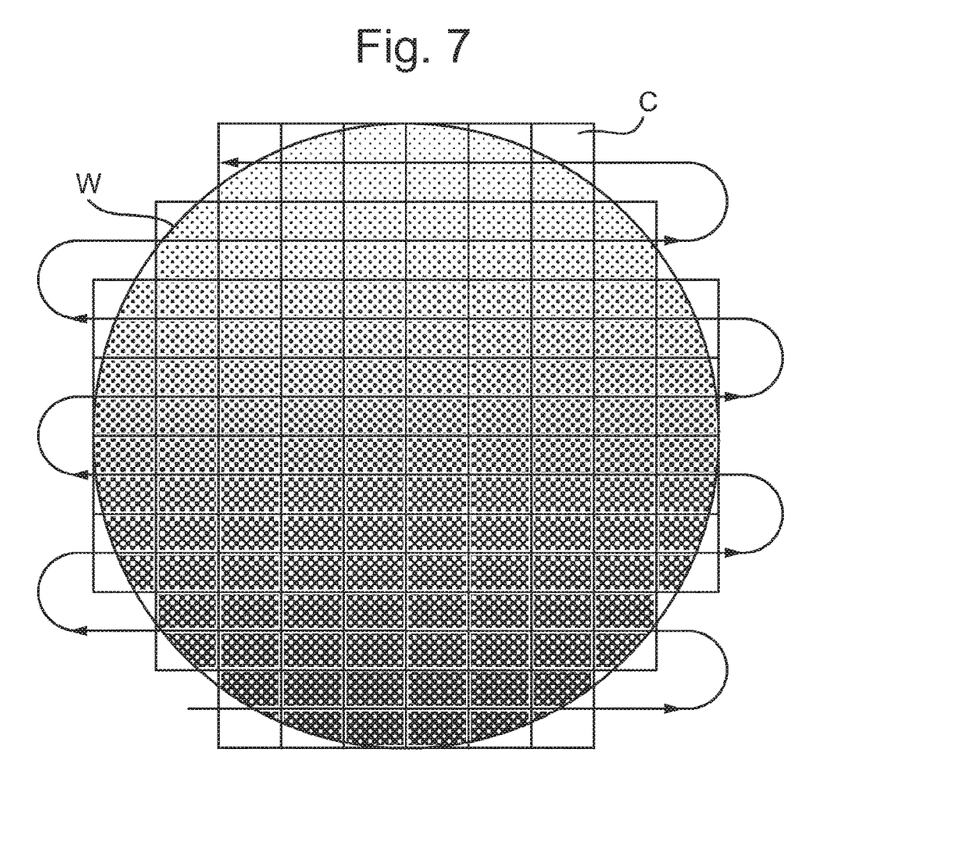
FIG. 7 schematically depicts variation in temperature of the patterning device during exposure of a substrate.

FIG. 7 schematically depicts how the temperature T of the patterning device MA can vary during an exposure operation of a substrate W. FIG. 7 schematically shows target portions C of the substrate W. Each rectangle in FIG. 7 represents a target portion C of the substrate W. The meandering line represents the path of the radiation beam B on the substrate W. At the beginning of the meandering path, the temperature T of the patterning device MA is relatively low. By the end of the meandering path, the temperature of T of the patterning device MA has increased because the patterning device MA has absorbed energy from the radiation beam B. In FIG. 7, the darker shading represents a lower temperature T of the patterning device MA. The lighter shading represents a higher temperature T of the patterning device MA. By thermally conditioning the patterning device MA dependent on the amount of exposure radiation absorbed by the patterning device MA, the overlay penalty between two layers of the exposed substrate can be reduced. For example, in an embodiment the controller 500 is configured to control the thermal conditioner 20 to cool the patterning device MA more strongly when the amount of the exposure radiation absorbed by the patterning device MA during exposure of a substrate W is greater. Accordingly, the difference in temperature variation of the patterning device MA between two layers of the exposed substrate may be reduced, even within the time period of exposing a single substrate W. Hence temperature drift during the time period for exposing a single substrate W can be compensated for in the same way as compensating for temperature drift during exposure of a batch of substrates W.

In an embodiment the method comprises thermally conditioning the patterning device MA during a substrate exposure operation performing a patterned layer on a substrate W, such that the temperature of the patterning device MA during the substrate exposure operations substantially matches a known temperature of a patterning device MA during another substrate exposure operation performing another patterned layer on a substrate W.

An embodiment of the invention is expected to improve overlay by removing heating effects in the patterning device MA that lead to the overlay. An embodiment of the invention is expected to have no negative impact on the throughput.

In any of the above embodiments, the lithographic apparatus may further comprise a gas extractor 26 as depicted in FIG. 3. The gas extractor 26 is configured to extract gas above the patterning device MA, i.e. extract the gas flow 25. The gas extractor 26 may optionally be included in any of the embodiments, but is not essential to the invention. The gas extractor 26 is positioned and configured to receive the gas flow 25 that travels across the planar surface 22 of the patterning device MA.

The gas extractor 26 may be positioned on substantially an opposite side of the patterning device MA from the thermal conditioner 20 when viewed in plan view. The gas extractor 26 may extract the gas as the gas flow 25 reaches the opposite side of the patterning device MA from the thermal conditioner 20 when viewed in plan view. In some embodiments, extraction of the gas at the gas extractor 26 can be active or passive. The gas extractor 26 may comprise any number of gas inlet openings and may comprise a low pressure system for pulling in gas.

In an embodiment the lithographic apparatus comprises a purge plate 27, as shown in FIG. 3. In an embodiment the gas extractor 26 is surrounded by the purge plate 27 so that there is no gap between the purge plate 27 and the gas extractor 26. The purge plate 27 forms a barrier to block gas that might otherwise flow perpendicularly to the gas flow 25. The purge plate 27 is configured to form a boundary of a micro-environment for the gas flow 25.

Many of the examples above have been described in the context of a dry lithographic apparatus. However, an embodiment of the invention is equally applicable to an immersion lithographic apparatus. As will be appreciated, any of the above-described features can be used with any other feature and it is not only those combinations explicitly described which are covered in this application.

As will be appreciated, any of the above described features can be used with any other feature and it is not only those combinations explicitly described which are covered in this application. Furthermore, although embodiments of the invention have been described above in the context of a dry lithographic apparatus for convenience, it will be appreciated that an embodiment of the invention may be used in conjunction with any form of lithographic apparatus.

In an embodiment, there is provided a patterning device cooling system for thermally conditioning a patterning device of a lithographic apparatus, wherein the patterning device in use, is being irradiated by exposure radiation, wherein the patterning device cooling system comprises: a thermal conditioner configured to thermally condition the patterning device; and a controller configured to control the thermal conditioner dependent on an amount of the exposure radiation absorbed by the patterning device.

In an embodiment, the controller is configured to control the thermal conditioner dependent on at least one of the following: an amount of the exposure radiation per unit time incident on the patterning device; a proportion of the exposure radiation incident on the patterning device that is absorbed by the patterning device; a scanning speed at which the patterning device is scanned by the exposure radiation; and/or a length of an exposure path along which the patterning device is scanned by the exposure radiation. In an embodiment, the thermal conditioner comprises a nozzle configured to supply gas as a thermal conditioning flow to the patterning device, wherein the controller is configured to control at least one of: a temperature of the gas supplied by the thermal conditioner; and/or a flow rate of the gas supplied by the thermal conditioner.

In an embodiment, there is provided a method of thermally conditioning a patterning device of a lithographic apparatus, the patterning device being irradiated by exposure radiation in use, the method comprising: thermally conditioning the patterning device dependent on an amount of the exposure radiation absorbed by the patterning device.

In an embodiment, the method comprises thermally conditioning the patterning device dependent on at least one physical quantity representative of at least one of the following: an amount of the exposure radiation per unit time incident on the patterning device; a proportion of the exposure radiation incident on the patterning device that is absorbed by the patterning device; a scanning speed at which the patterning device is scanned by the exposure radiation; and/or a length of an exposure path along which the patterning device is scanned by the exposure radiation. In an embodiment, the method further comprises: supplying gas as a thermal conditioning flow to the patterning device; and controlling at least one of: a temperature of the gas supplied to the patterning device; and/or a flow rate of the gas supplied to the patterning device. In an embodiment, the method comprises: thermally conditioning the patterning device dependent on at least one physical quantity associated with exposure of a first layer of a substrate stack; and thermally conditioning the patterning device dependent on at least one physical quantity associated with exposure of a second layer of a substrate stack, wherein the at least one physical quantity associated with exposure of the first layer is different from the at least one physical quantity associated with exposure of the second layer. In an embodiment, the method comprises: controlling at least one of: a temperature of gas supplied to the patterning device such that the temperature of gas when exposing the first layer is different from the temperature of gas when exposing the second layer; and/or a flow rate of gas supplied to the patterning device such that the flow rate of gas when exposing the first layer is different from the flow rate of gas when exposing the second layer. In an embodiment, the method comprises thermally conditioning the patterning device during a batch exposure operation for forming a patterned layer on each of a batch of substrates, such that the temperature of the patterning device during the batch exposure operation substantially matches a known temperature of a patterning device during another batch exposure operation for forming another patterned layer on each of a batch of substrates. In an embodiment, the method comprises thermally conditioning the patterning device during a substrate exposure operation for forming a patterned layer on a substrate, such that the temperature of the patterning device during the substrate exposure operation substantially matches a known temperature of a patterning device during another substrate exposure operation for forming another patterned layer on a substrate.

While specific embodiments of the invention have been described above, it will be appreciated that the invention may be practiced otherwise than as described. The descriptions above are intended to be illustrative, not limiting. Thus, it will be apparent to one skilled in the art that modifications may be made to the invention as described without departing from the scope of the claims set out below.

The invention claimed is:

1. A patterning device cooling system for thermally conditioning a patterning device of a lithographic apparatus, the patterning device configured to be, in use, irradiated by exposure radiation, wherein the patterning device cooling system comprises:
    a controller configured to control a thermal conditioner configured to thermally condition the patterning device to at least:
        thermally condition the patterning device for exposures of a first layer of a substrate stack, and
        thermally condition a patterning device for exposures of a second layer of the substrate stack after the exposures of the first layer of the substrate stack,
        wherein the thermal conditioning is controlled such that a temperature over time of the patterning device for exposures of the second layer substantially matches different temperatures over time of the patterning device for exposures of the first layer.

2. The patterning device cooling system of claim 1, wherein the controller is configured to control for patterning device deformation arising during exposure of the first layer and/or for exposure of the second layer, dependent on one or more selected from:
    an amount of the exposure radiation per unit time incident on the patterning device for exposure of the first layer and/or for exposure of the second layer;
    a proportion of the exposure radiation incident on the patterning device for exposure of the first layer and/or for exposure of the second layer that is absorbed by that patterning device;
    a scanning speed at which the patterning device for exposure of the first layer and/or for exposure of the second layer is scanned by the exposure radiation; and/or
    a length of an exposure path along which the patterning device for exposure of the first layer and/or for exposure of the second layer is scanned by the exposure radiation.

3. The patterning device cooling system of claim 1, wherein the controller is configured to control a temperature of a gas supplied by the thermal conditioner as a thermal conditioning flow to the patterning device for exposure of the first layer and/or for exposure of the second layer and/or control a flow rate of a gas supplied by the thermal conditioner as a thermal conditioning flow to the patterning device for exposure of the first layer and/or for exposure of the second layer.

4. The patterning device cooling system of claim 1, wherein the controller is configured to control the thermal conditioner dependent on:
    at least one physical quantity associated with exposure of the first layer of the substrate stack, and
    at least one physical quantity associated with exposure of the second layer of the substrate stack,
    wherein the at least one physical quantity associated with exposure of the first layer is different from the at least one physical quantity associated with exposure of the second layer.

5. The patterning device cooling system of claim 4, wherein the controller is configured to control one or more selected from:
a temperature of gas supplied to the patterning device for exposure of the first layer and/or for exposure of the second layer such that the temperature of gas when exposing the first layer is different from the temperature of gas when exposing the second layer; and/or
a flow rate of gas supplied to the patterning device for exposure of the first layer and/or for exposure of the second layer such that the flow rate of gas when exposing the first layer is different from the flow rate of gas when exposing the second layer.

6. The patterning device cooling system of claim 1, wherein the controller is configured to control the thermal conditioner to thermally condition the patterning device for exposure of the first or second layer during a batch exposure operation for exposure of the respective first or second layer on each of a plurality of substrates of a batch of substrates, such that the temperature of that patterning device during the batch exposure operation substantially matches a known temperature of the patterning device for exposure of the other of the first or second layer during another batch exposure operation for exposure of the other of the first or second layer on each of the plurality of substrates of the batch of substrates.

7. The patterning device cooling system of claim 1, wherein the controller is configured to control the thermal conditioner to thermally condition the patterning device for exposure of the first or second layer during a substrate exposure operation for exposing the respective first or second layer on a substrate, such that the temperature of that patterning device during the substrate exposure operation substantially matches a known temperature of the patterning device for exposure of the other of the first or second layer during another substrate exposure operation for exposing the other of the first or second layer on a substrate.

8. The patterning device cooling system of claim 1, wherein the controller is configured to control the thermal conditioner dependent on an amount of the exposure radiation per unit time incident on the patterning device for exposure of the first layer and/or for exposure of the second layer, and/or dependent on a proportion of the exposure radiation incident on the patterning device for exposure of the first layer and/or for exposure of the second layer that is absorbed by that patterning device.

9. The patterning device cooling system of claim 1, wherein the patterning device for exposure of the first layer is a different patterning device than the patterning device for exposure of the second layer.

10. The patterning device cooling system of claim 1, further comprising the thermal conditioner configured to thermally condition the patterning device.

11. The patterning device cooling system of claim 1, further comprising a purge plate above the patterning device for exposure of the first layer and/or for exposure of the second layer.

12. The patterning device cooling system of claim 11, further comprising a gas extractor formed in the purge plate and configured to extract a gas flow above the patterning device for exposure of the first layer and/or for exposure of the second layer.

13. A lithographic apparatus comprising:
a support configured to hold a patterning device;
a thermal conditioner configured to thermally condition the patterning device;
the patterning device cooling system of claim 1; and
a projection system configured to project a beam as patterned by the patterning device onto a substrate.

14. A method of thermally conditioning a patterning device of a lithographic apparatus, the patterning device being irradiated by exposure radiation in use, the method comprising:
thermally conditioning the patterning device for exposures of a first layer of a substrate stack; and
thermally conditioning a patterning device for exposures of a second layer of the substrate stack after the exposures of the first layer of the substrate stack,
wherein the thermal conditioning is controlled such that a temperature over time of the patterning device for exposures of the second layer substantially matches different temperatures over time of the patterning device for exposures of the first layer.

15. The method of claim 14, further comprising:
supplying gas as a thermal conditioning flow to the patterning device for exposure of the first layer and/or for exposure of the second layer; and
controlling a temperature of the gas supplied to the patterning device for exposure of the first layer and/or for exposure of the second layer and/or controlling a flow rate of the gas supplied to the patterning device for exposure of the first layer and/or for exposure of the second layer.

16. The method of claim 14, wherein:
thermally conditioning the patterning device for exposure of the first layer is dependent on at least one physical quantity associated with exposure of the first layer of the substrate stack; and
thermally conditioning the patterning device for exposure of the second layer is dependent on at least one physical quantity associated with exposure of the second layer of the substrate stack,
wherein the at least one physical quantity associated with exposure of the first layer is different from the at least one physical quantity associated with exposure of the second layer.

17. The method of claim 16, comprising controlling a temperature of gas for the thermal conditioning such that the temperature of gas when exposing the first layer is different from the temperature of gas when exposing the second layer and/or controlling a flow rate of gas for the thermal conditioning such that the flow rate of gas when exposing the first layer is different from the flow rate of gas when exposing the second layer.

18. The method of claim 14, comprising thermally conditioning the patterning device for exposure of the first or second layer during a batch exposure operation for exposure of the respective first or second layer on each of a plurality of substrates of a batch of substrates, such that the temperature of that patterning device during the batch exposure operation substantially matches a known temperature of a patterning device for exposure of the other of the first or second layer during another batch exposure operation for exposure of the other of the first or second layer on each of the plurality of substrates of the batch of substrates.

19. The method of claim 14, comprising thermally conditioning the patterning device for exposure of the first or second layer during a substrate exposure operation for exposing the respective first or second layer on a substrate, such that the temperature of that patterning device during the substrate exposure operation substantially matches a known temperature of a patterning device for exposure of the other of the first or second layer during another substrate exposure operation for exposing the other of the first or second layer on a substrate.

20. The method of claim 14, comprising controlling for patterning device deformation arising during exposure of the first layer and/or for exposure of the second layer, dependent on at least one physical quantity representative of one or more selected from:
- an amount of the exposure radiation per unit time incident on the patterning device for exposure of the first layer and/or for exposure of the second layer;
- a proportion of the exposure radiation incident on the patterning device for exposure of the first layer and/or for exposure of the second layer that is absorbed by that patterning device;
- a scanning speed at which the patterning device for exposure of the first layer and/or for exposure of the second layer is scanned by the exposure radiation; and/or
- a length of an exposure path along which the patterning device for exposure of the first layer and/or for exposure of the second layer is scanned by the exposure radiation.

21. The method of claim 14, wherein the patterning device for exposure of the first layer is a different patterning device than the patterning device for exposure of the second layer.

* * * * *